United States Patent
Tanifuji et al.

(10) Patent No.: US 9,818,586 B2
(45) Date of Patent: Nov. 14, 2017

(54) ARC EVAPORATION SOURCE

(71) Applicant: Kobe Steel, Ltd., Kobe-shi (JP)

(72) Inventors: Shinichi Tanifuji, Kobe (JP); Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 184 days.

(21) Appl. No.: 14/397,550

(22) PCT Filed: Jun. 11, 2013

(86) PCT No.: PCT/JP2013/066088
§ 371 (c)(1),
(2) Date: Oct. 28, 2014

(87) PCT Pub. No.: WO2013/191038
PCT Pub. Date: Dec. 27, 2013

(65) Prior Publication Data
US 2015/0122644 A1    May 7, 2015

(30) Foreign Application Priority Data
Jun. 20, 2012  (JP) .................. 2012-139078

(51) Int. Cl.
  *C23C 14/34*  (2006.01)
  *H01J 37/34*  (2006.01)
  (Continued)

(52) U.S. Cl.
  CPC .......... *H01J 37/345* (2013.01); *C23C 14/325* (2013.01); *C23C 14/505* (2013.01);
  (Continued)

(58) Field of Classification Search
  CPC .... C23C 14/325; C23C 14/505; H01J 37/345; H01J 37/32055; H01J 37/32669; H01J 37/34; H01J 37/3405
  See application file for complete search history.

(56) References Cited

U.S. PATENT DOCUMENTS 6,334,405 B1   1/2002   Takahara et al.
9,200,360 B2 *  12/2015   Tanifuji ................ C23C 14/325
(Continued)

FOREIGN PATENT DOCUMENTS

EP   1 020 541 A2   7/2000
EP   1 020 541 A3   7/2000
(Continued)

OTHER PUBLICATIONS

Translation to Tanifuji (JP 2012-026026 as cited on IDS) published Feb. 9, 2012.*
(Continued)

*Primary Examiner* — John Brayton
(74) *Attorney, Agent, or Firm* — Oblon, McClelland, Maier & Neustadt, L.L.P.

(57) ABSTRACT

Provided is an arc evaporation source equipped with a target, a ring-shaped magnetic field guide magnet and a back side magnetic field generation source. The magnetic field guide magnet is aligned in a direction perpendicular to the evaporation face of the target and has a polarity that is the magnetization direction facing forward or backward. The back side magnetic field generation source is disposed at the rear of the magnetic field guide magnet, which is at the side of the back side of the target, and forms magnetic force lines running in the direction of magnetization of the magnetic field guide magnet. The target is disposed such that the evaporation face is positioned in front of the magnetic field guide magnet.

12 Claims, 5 Drawing Sheets

(a)

(b)

(51) Int. Cl.
   *C23C 14/32*   (2006.01)
   *C23C 14/50*   (2006.01)
   *H01J 37/32*   (2006.01)

(52) U.S. Cl.
   CPC .. *H01J 37/32055* (2013.01); *H01J 37/32669* (2013.01); *H01J 37/34* (2013.01); *H01J 37/3405* (2013.01)

(56) References Cited

U.S. PATENT DOCUMENTS

| | | |
|---|---|---|
| 2004/0112736 A1 | 6/2004 | Larrinaga |
| 2004/0157090 A1 | 8/2004 | Yamamoto et al. |
| 2006/0237309 A1 | 10/2006 | Goikoetxea Larrinaga |
| 2008/0110749 A1 | 5/2008 | Krassnitzer et al. |
| 2009/0050059 A1* | 2/2009 | Goikoetxea Larrinaga ............ C23C 14/243 118/726 |
| 2010/0213055 A1 | 8/2010 | Vetter |
| 2012/0037493 A1 | 2/2012 | Tanifuji et al. |
| 2013/0098881 A1 | 4/2013 | Tanifuji et al. |

FOREIGN PATENT DOCUMENTS

| | | |
|---|---|---|
| EP | 1 382 711 A1 | 1/2004 |
| EP | 2 426 231 A1 | 3/2012 |
| JP | 11-269634 A | 10/1999 |
| JP | 2004-523658 A | 8/2004 |
| JP | 2004-256914 A | 9/2004 |
| JP | 2010-275625 A | 12/2010 |
| JP | 2012-026026 A | 2/2012 |
| WO | WO 2007/131944 A2 | 11/2007 |
| WO | WO 2007/131944 A3 | 11/2007 |
| WO | WO 2008/125397 A1 | 10/2008 |
| WO | WO 2010/125756 * | 11/2010 |
| WO | 2012/115203 A1 | 8/2012 |

OTHER PUBLICATIONS

International Search Report and Written Opinion dated Jul. 16, 2013 in PCT/JP2013/066088 filed Jun. 11, 2013.
Extended European Search Report dated Dec. 2, 2015 in Patent Application No. 13806135.3.

* cited by examiner (a)

(b)

(a)

(b)

ARC EVAPORATION SOURCE

TECHNICAL FIELD

The present invention relates to an arc evaporation source of a film deposition device that forms a thin film, such as a ceramic film of, for example, a nitride or an oxide; or an amorphous carbon film, used for improving wear resistance of a machine part or the like.

BACKGROUND ART

Conventionally, in order to improve the wear resistance, sliding characteristic, and protection function of a machine part, a cutting tool, a sliding part, etc., there has been widely used a physical vapor deposition method of coating a surface of a substrate, which is the part or tool, with a thin film. An arc ion plating method and a sputtering method are widely known as examples of the physical vapor deposition method. The arc ion plating method is a technology using a cathode-discharge arc evaporation source.

In the cathode-discharge arc evaporation source (hereinafter, referred to as arc evaporation source), arc discharge is generated on a surface of a target being a cathode, and hence a substance forming the target is instantly molten, evaporated, and ionized. The arc evaporation source attracts the substance ionized by the arc discharge to the substrate side serving as a subject to be processed, and forms a thin film on the surface of the substrate. In the arc evaporation source, since the evaporation speed of the target is high and the ionization rate of the evaporated substance is high, a dense coating can be formed by applying a bias to the substrate during the film formation. Hence, the arc evaporation source is industrially used in order to form a wear-resistant coating on the surface of the cutting tool or the like.

Target atoms, which are evaporated by the arc discharge, are highly ionized in arc plasma. In this case, transportation of ions from the target toward the substrate is affected by the magnetic field between the target and the substrate, and the path of ions extends along magnetic force lines extending from the target toward the substrate.

However, in arc discharge generated between a cathode (target) and an anode, when the target is evaporated around an electron discharge spot (arc spot) at the cathode side, the molten target (macroparticles), which is melted from an area near the arc spot and is before evaporated, may be discharged. The adhesion of the molten target to the subject to be processed may cause the surface roughness of the thin film to be decreased.

With regard to this, if the arc spot moves at high speed, the amount of macroparticles tends to be reduced. However, the moving speed of the arc spot is affected by the magnetic field applied to the surface of the target.

To address such a problem, a technology of applying the magnetic field to the surface of the target and controlling the movement of the arc spot has been suggested as follows.

PTL 1 discloses an arc evaporation source including an outer peripheral magnet surrounding the outer periphery of a target and having a magnetization direction along a direction perpendicular to a surface of the target, and a back side magnet having a polarity in the same direction as that of the outer peripheral magnet and having a magnetization direction in a direction perpendicular to the surface of the target. With this arc evaporation source, it is expected that the straightness of magnetic force lines can be improved.

PTL 2 discloses an arc evaporation apparatus that forms a parallel magnetic field on a surface of a target by a ring-shaped magnet arranged around the target and an electro-magnetic coil at a back side. With this arc evaporation apparatus, it is expected that arc can be induced according to any track from the center of the target to an outer edge portion.

CITATION LIST

Patent Literature

PTL 1: Japanese Unexamined Patent Application Publication No. 2010-275625

PTL 2: Japanese Unexamined Patent Application Publication (Translation of PCT Application) No. 2004-523658

SUMMARY OF INVENTION

Technical Problem

The arc evaporation source disclosed in PTL 1 generates magnetic force lines in a direction from the surface of the target toward a substrate by two disk-shaped magnets arranged at an interval at a back side of the target. The two disk-shaped magnets can generate magnetic force lines with high straightness at a center portion; however, magnetic force lines emitted from an outer periphery side of the center portion diverge outward with respect to the axis of the disk-shaped magnets. This is an unavoidable phenomenon as a typical characteristic of a magnet. To efficiently induce an ionized target substance in a substrate direction, the arc evaporation source in PTL 1 should be further improved.

Further, with the arc evaporation apparatus disclosed in PTL 2, magnetic force lines with high straightness are generated from a center portion of the electro-magnetic coil; however, magnetic force lines emitted from an outer periphery side of the center portion of the electro-magnetic coil diverge outward with respect to the axis of the electro-magnetic coil.

That is, with the technologies disclosed in PTL 1 and PTL 2, the magnetic force lines with high straightness from the front side of the target toward the substrate can be generated only at the center portion of the target in view of characteristics of the magnet and the electromagnet provided at the back side of the target. Owing to this, with the technologies disclosed in PTL 1 and PTL 2, magnetic force lines with high straightness cannot be formed at the entire face of the target. It is difficult to sufficiently increase the film deposition speed.

Also, like PTL 1 and PTL 2, if the outer peripheral magnet or the ring-shaped magnet is arranged so that an end face of the magnet at the substrate direction side is close to the substrate with respect to the surface of the target, and if the back side magnet or the electro-magnetic coil having the same magnetization direction as that of the outer peripheral magnet or the ring-shaped magnet is arranged at the rear of the target (opposite direction side of the substrate), magnetic force lines (parallel magnetic field) being parallel to the surface of the target are formed at a portion on the surface of the target. If such a parallel magnetic field is formed on the surface of the target, arc discharge is trapped by the parallel magnetic field, and the arc discharge becomes stable. However, the discharge position becomes uneven on the surface of the target, and consequently uneven wear of the target may occur.

In light of the above-described problems, an object of the present invention is to provide an arc evaporation source that can generate magnetic force lines with high straightness extending from a surface of a target in a substrate direction, in a wide region of the surface of the target; and can restrict uneven wear of the target.

Solution to Problem

To attain the above-described object, the present invention employs the following technical means.

An arc evaporation source according to the present invention includes a target, a ring-shaped magnetic field guide magnet, and a back side magnetic field generation source. The magnetic field guide magnet has a polarity with a magnetization direction extending along a direction perpendicular to an evaporation face of the target and facing front or rear. The back side magnetic field generation source is arranged at the side of a back side of the target, the side being the rear of the magnetic field guide magnet, and forms magnetic force lines along the magnetization direction of the magnetic field guide magnet. The target is arranged so that the evaporation face is located at the front with respect to the magnetic field guide magnet.

Then, a magnetization direction of the back side magnetic field generation source may preferably face the front if the magnetization direction of the magnetic field guide magnet faces the front, and the magnetization direction of the back side magnetic field generation source may preferably face the rear if the magnetization direction of the magnetic field guide magnet faces the rear.

In this case, in projection of the magnetic field guide magnet and the target in the magnetization direction of the magnetic field guide magnet, the target may be preferably arranged so that the target is projected at a diameter inner side with respect to an intermediate position between an inner peripheral face and an outer peripheral face in a radial direction of the magnetic field guide magnet.

Also, the back side magnetic field generation source may preferably form magnetic force lines passing through a tunnel part or a duct part formed by the inner peripheral face of the ring-shaped magnetic field guide magnet, along the magnetization direction of the magnetic field guide magnet. The target may be preferably arranged at a position so that the magnetic force lines passing through the evaporation face become parallel to the axis of the ring-shaped magnetic field guide magnet or inclined toward the axis.

In this case, the back side magnetic field generation source may preferably include a ring-shaped back side magnet having polarities at an inner peripheral face and an outer peripheral face, a magnetization direction of the back side magnet by the polarities of the inner peripheral face and the outer peripheral face may preferably face a ring diameter inner side direction if the magnetization direction of the magnetic field guide magnet faces the front, and the magnetization direction of the back side magnet by the polarities of the inner peripheral face and the outer peripheral face may preferably face a ring diameter outer side direction if the magnetization direction of the magnetic field guide magnet faces the rear.

In addition, the back side magnetic field generation source may preferably include a plurality of the ring-shaped back side magnets, and the plurality of ring-shaped back side magnets may preferably have polarities with the same magnetization direction and may be preferably coaxially arranged.

Further, a magnetic material penetrating through each back side magnet may be preferably provided at a diameter inner side of the plurality of ring-shaped back side magnets, and an outer periphery of the magnetic material may preferably contact the inner peripheral face of each back side magnet.

In this case, the back side magnetic field generation source may preferably include a first disk-shaped magnet and a second disk-shaped magnet having disk shapes and arranged at an interval, the first disk-shaped magnet and the second disk-shaped magnet may each preferably have polarities at disk-shaped faces with a magnetization direction from one of the disk-shaped faces to the other disk-shaped face and may be preferably arranged to have the same magnetization direction, the magnetization direction by the first disk-shaped magnet and the second disk-shaped magnet may preferably face the front if the magnetization direction of the magnetic field guide magnet faces the front, and the magnetization direction by the first disk-shaped magnet and the second disk-shaped magnet may preferably face the rear if the magnetization direction of the magnetic field guide magnet faces the rear.

Also, a magnetic material may be preferably provided between the first disk-shaped magnet and the second disk-shaped magnet, the magnetic material contacting each disk-shaped magnet.

Here, the back side magnetic field generation source may be an air-cored electro-magnetic coil, and the electro-magnetic coil may preferably have a polarity in the same direction as the direction of the polarity of the magnetic field guide magnet.

Also, a magnetic material may be preferably arranged in an air core portion of the electro-magnetic coil.

Advantageous Effects of Invention

With the arc evaporation source of the present invention, the magnetic force lines with high straightness extending from the surface of the target in the substrate direction can be generated in the wide region of the surface of the target, and the uneven wear of the target can be restricted.

DESCRIPTION OF EMBODIMENTS

Embodiments of the present invention are described below on the basis of the drawings.

First Embodiment

Figure 1:
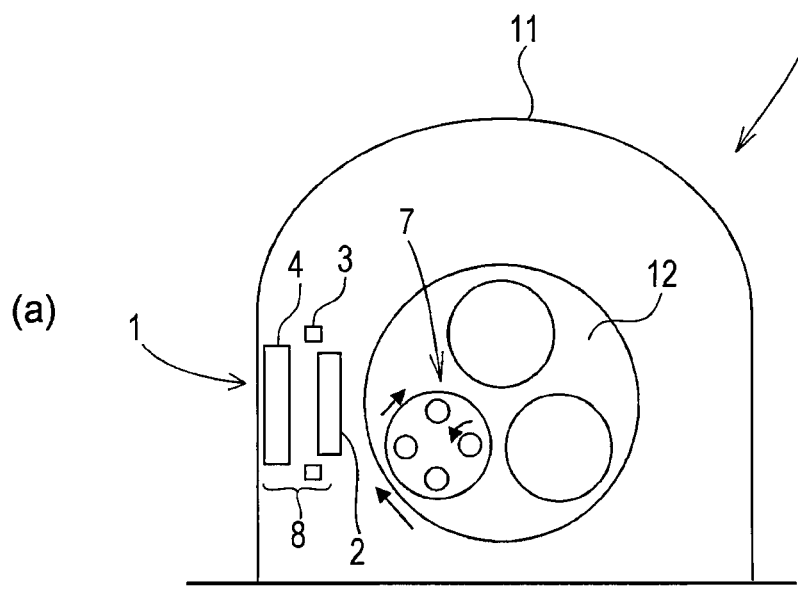
FIG. 1(a) is a side view showing a brief configuration of a film deposition device including an arc evaporation source according to a first embodiment of the present invention.
FIG. 1(b) is a plan view showing the brief configuration of the film deposition device.
Figure 1:
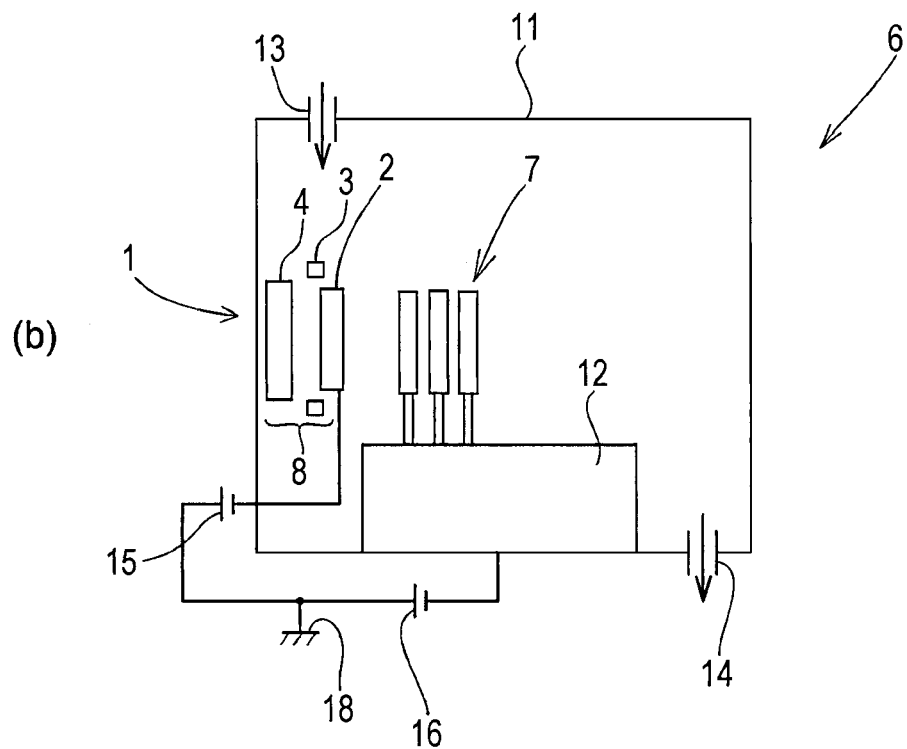

A first embodiment of the present invention is described with reference to FIGS. 1 to 4. FIG. 1(a) to FIG. 1(b) show a film deposition device 6 including an arc evaporation source 1 (hereinafter, referred to as evaporation source 1) according to the first embodiment of the present invention. FIG. 1(a) is a side view showing a brief configuration of the film deposition device 6, and FIG. 1(b) is a plan view showing the brief configuration of the film deposition device 6.

The film deposition device 6 includes a chamber 11. A rotating base 12 that supports a substrate 7 being a subject to be processed, and the evaporation source 1 arranged to face the substrate 7 are provided in the chamber 11. The chamber 11 has a gas introduction port 13 for introducing reactant gas into the chamber 11, and a gas exhaust port 14 for exhausting the reactant gas from the chamber 11.

In addition, the film deposition device 6 includes an arc power supply 15 that applies a negative bias to a target 2 of the evaporation source 1 (described later in detail), and a bias power supply 16 that applies a negative bias to the substrate 7. The cathode sides of both power supplies 15 and 16 are grounded to a ground 18.

As shown in FIG. 1(a) and FIG. 1(b), the evaporation source 1 includes the disk-shaped target 2 (hereinafter, "disk shape" including a columnar shape having a predetermined height) having a predetermined thickness and arranged so that an evaporation face thereof faces the substrate 7, and magnetic field forming means 8 (formed of a magnetic field guide magnet 3 and a back side magnetic field generation source 4). In this embodiment, the chamber 11 acts as an anode. With this configuration, the evaporation source 1 functions as a cathode-discharge arc evaporation source.

A configuration of the evaporation source 1 included in the film deposition device 6 is described below with reference to FIG. 1(a) to FIG. 1(b), and FIG. 2(a). FIG. 2(a) is an illustration showing a basic configuration of the evaporation source 1 according to this embodiment.

The evaporation source 1 includes the disk-shaped target 2 having a predetermined thickness, and the magnetic field forming means 8 arranged near the target 2.

In the following description, a face being the evaporation face of the target 2 and facing the substrate 7 side (substrate direction) is called "front side (target front side)," and a face facing the opposite side (direction opposite to the substrate) is called "back side (target back side)" (see FIG. 2(a)).

The target 2 is formed of a material selected in accordance with a thin film to be formed on the substrate 7. The material may be, for example, a metal material, such as chromium (Cr), titanium (Ti), or titanium aluminum (TiAl); or a material that can be ionized, such as carbon (C).

The magnetic field forming means 8 includes the magnetic field guide magnet 3 being ring-shaped (annular-shaped or donut-shaped) and arranged at the side of the back side with respect to the evaporation face of the target 2, and the back side magnetic field generation source 4 being ring-shaped (annular-shaped or donut-shaped) or columnar-shaped and arranged at the side of the back side of the target 2 coaxially with the magnetic field guide magnet 3. The magnetic field guide magnet 3 and the back side magnetic field generation source 4 are each formed of, for example, a permanent magnet made of a neodymium magnet having a high coercive force.

That is, the evaporation source 1 is formed by arranging the target 2, the magnetic field guide magnet 3, and the back side magnetic field generation source 4 so that mutual axes are substantially aligned with each other.

The magnetic field guide magnet 3 has a ring body as described above, and has an inner diameter (inner dimension) being slightly larger than (about 1 to 2 times) the diameter (dimension) of the target 2, and a predetermined height (thickness) along the axial direction. The height (thickness) of the magnetic field guide magnet 3 is substantially the same as or slightly smaller than the height (thickness) of the target 2 along the axial direction.

The appearance of the ring-shaped magnetic field guide magnet 3 is formed of two annular-shaped faces (annular faces) being parallel to each other and facing the front side or the back side of the target 2, and two peripheral faces connecting the two annular faces in the axial direction. The two peripheral faces are an inner peripheral face 31 formed at the inner periphery side (diameter inner side) of the annular faces, and an outer peripheral face 32 formed at the outer periphery side (diameter outer side) of the annular faces. The widths of the inner peripheral face 31 and the outer peripheral face 32 are, in other words, a thickness (thickness in the radial direction) of the magnetic field guide magnet 3.

Now, the arrangement of the target 2 with respect to the magnetic field guide magnet 3 is further described with reference to FIG. 2(b). FIG. 2(b) is a projection view when the target 2 and the magnetic field guide magnet 3 are projected along a direction perpendicular to the evaporation face of the target 2. FIG. 2(b) can be also called projection view when the target 2 and the magnetic field guide magnet 3 are viewed from the substrate 7 side.

In the projection diagram in FIG. 2(b), the shapes of the target 2 and the magnetic field guide magnet 3 are formed so that the projected shape of the inner peripheral face 31 at the diameter inner side of the magnetic field guide magnet 3 is similar to the projected shape of the target 2. Also, the target 2 is arranged to be projected at the diameter inner side with respect to an intermediate position 33 between the inner peripheral face 31 and the outer peripheral face 32 in the radial direction of the magnetic field guide magnet 3 in the projection diagram in FIG. 2(b).

The projection diagram shown in FIG. 2(b) represents arrangement of the target 2 and the magnetic field guide magnet 3 in front view when the target 2 is viewed from the front side. That is, when viewed from the front side, the target 2 is located at the diameter inner side with respect to the intermediate position 33 between the inner peripheral face 31 and the outer peripheral face 32 in the radial direction of the magnetic field guide magnet 3.

As shown in FIG. 2(a), the magnetic field guide magnet 3 is configured so that a front annular face (front end face) facing the substrate 7 side serves as the N-pole and a rear annular face (rear end face) facing the opposite side serves as the S-pole. In the drawing, arrows from the magnetic pole (S-pole) of the annular face at the rear of the magnetic field guide magnet 3 toward the magnetic pole (N-pole) of the annular face at the front are shown. Hereinafter, a direction of the arrows from the S-pole to the N-pole is called magnetization direction. The magnetic field guide magnet 3 of this embodiment is arranged so that the magnetization direction extends along a direction perpendicular to the front side (evaporation face) of the target 2 and faces the front.

Figure 2:
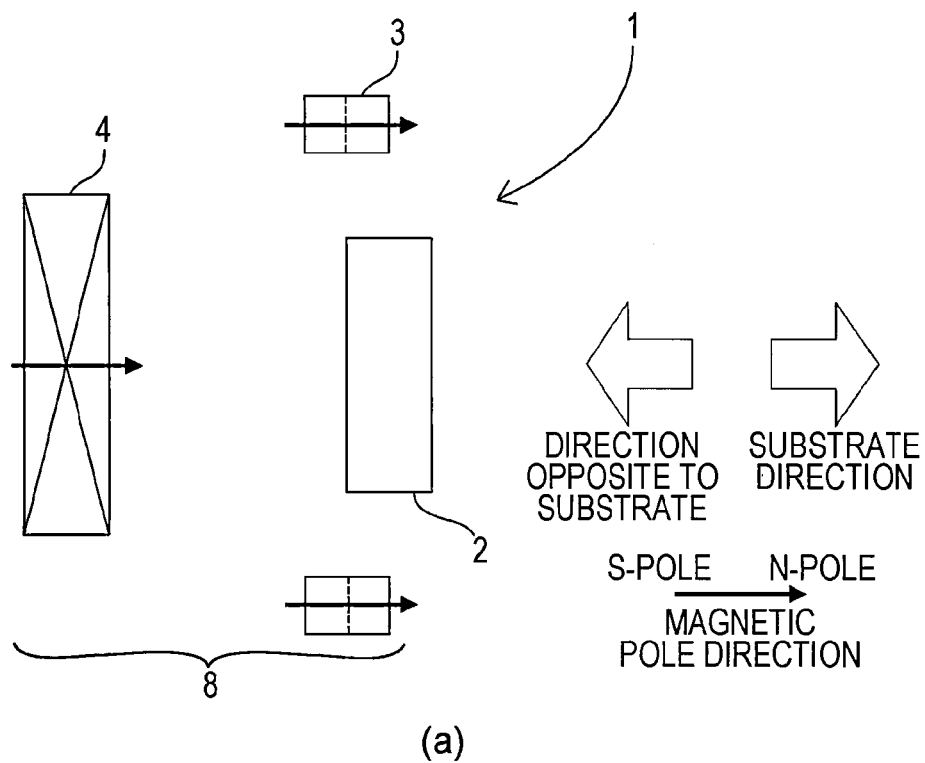
FIG. 2(a) is an illustration showing a basic configuration of the arc evaporation source according to the first embodiment of the present invention.
FIG. 2(b) is a projection view when a magnetic field guide magnet and a target are projected along a direction perpendicular to an evaporation face of the target.
Figure 2:
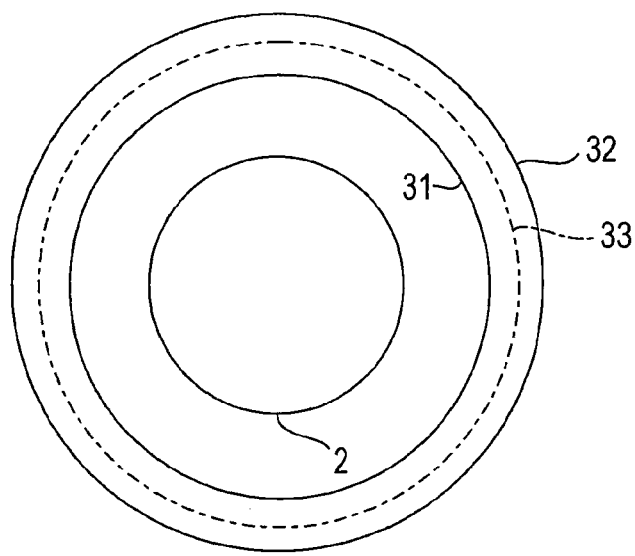

Now, FIG. 2(*b*) is referenced again. FIG. 2(*b*) can be also called projection diagram of the magnetic field guide magnet 3 and the target 2 in the magnetization direction of the magnetic field guide magnet 3. Hence, it can be also said that the target 2 is arranged at the diameter inner side with respect to the intermediate position 33 between the inner peripheral face 31 and the outer peripheral face 32 in the radial direction of the magnetic field guide magnet 3, in the projection of the magnetic field guide magnet 3 and the target 2 in the magnetization direction of the magnetic field guide magnet 3.

As described above, the magnetic field guide magnet 3 may have a ring-shaped or annular-shaped integral shape. However, a plurality of columnar-shaped or rectangular-parallelepiped-shaped magnets may be arranged in a ring shape or an annular shape to form the magnetic field guide magnet 3 so that the magnetization directions of these magnets extend along the direction perpendicular to the front side of the target 2 and face the front.

The magnetic field guide magnet 3 is arranged to be located at the rear with respect to the evaporation face of the target 2, that is, at the side of the back side. With this arrangement, the magnetic field guide magnet 3 is coaxial with the target 2. At this time, since the annular face at the front of the magnetic field guide magnet 3 is located at the rear with respect to the evaporation face of the target 2, it can be said that the target 2 is arranged at the front with respect to the annular face at the front of the magnetic field guide magnet 3.

For example, in FIG. 2(*a*) to FIG. 2(*b*), the target 2 is arranged so that the evaporation face thereof is located at the front with respect to the front end face of the magnetic field guide magnet 3. As described above, in this embodiment, the target 2 is arranged so that the projection of the target 2 viewed in the radial direction is located at a position at the front with respect to the projection of the magnetic field guide magnet 3 viewed in the radial direction. Thus, the target 2 is provided in the evaporation source 1.

Figure 3:
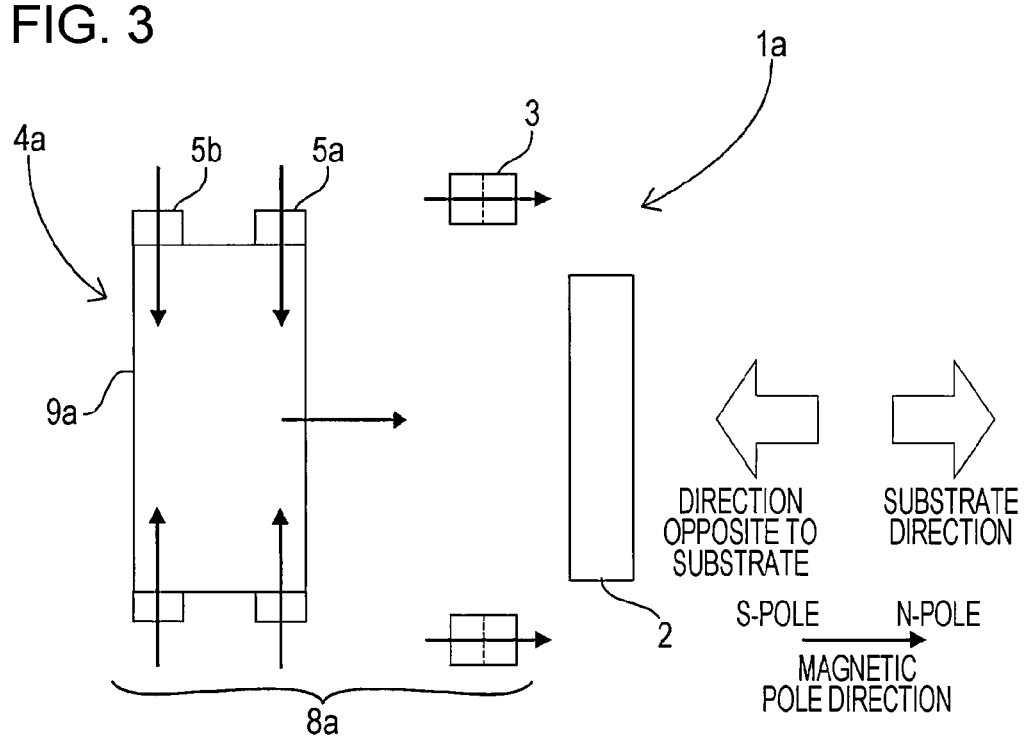
FIG. 3 is a schematic illustration showing a specific configuration of the arc evaporation source according to the first embodiment of the present invention.

Next, a specific configuration of the back side magnetic field generation source 4 is described with reference to FIG. 2(*a*) and FIG. 3. FIG. 3 is an illustration showing a configuration of an evaporation source 1*a*, which is a specific example of the evaporation source 1 according to this embodiment.

As indicated by an arrow in FIG. 2(*a*), the back side magnetic field generation source 4 generates a magnetic pole with the same magnetization direction as the magnetization direction of the magnetic field guide magnet 3. Also, as shown in FIG. 3, the evaporation source 1*a*, which is a specific example of the evaporation source 1, includes the above-described target 2 and magnetic field forming means 8*a*. The magnetic field forming means 8*a* includes the magnetic field guide magnet 3, and a back side magnetic field generation source 4*a*, which is a specific configuration of the back side magnetic field generation source 4.

The back side magnetic field generation source 4*a* is a ring-shaped magnet having substantially the same diameter as the diameter of the magnetic field guide magnet 3. In the back side magnetic field generation source 4*a*, a first back side magnet 5*a* and a second back side magnet 5*b* each having substantially the same inner diameter (inner dimension) and outer diameter (outer dimension) as those of the magnetic field guide magnet 3 are coaxially arranged. Hence, the first back side magnet 5*a* and the second back side magnet 5*b* each have an inner diameter being slightly larger than (about 1 to 2 times) the diameter of the target 2 and a predetermined height (thickness) along the axial direction.

The appearances of the ring-shaped first back side magnet 5*a* and second back side magnet 5*b* each also have two annular-shaped faces (front end face and rear end face) being parallel to each other and two peripheral faces (inner peripheral face and outer peripheral face) connecting the two annular faces along the axial direction, similarly to the magnetic field guide magnet 3. The width of the inner peripheral face and the outer peripheral face is the height (thickness) of each of the first back side magnet 5*a* and the second back side magnet 5*b* along the axial direction of the magnetic field guide magnet 3.

As shown in FIG. 3, the first back side magnet 5*a* and the second back side magnet 5*b* are each configured to have the magnetization direction so that an inner peripheral face at the diameter inner side serves as the N-pole and an outer peripheral face at the opposite diameter outer side serves as the S-pole. In the drawing, arrows indicative of the magnetic direction from the outer peripheral faces (S-poles) toward the inner peripheral faces (N-poles) of the first back side magnet 5*a* and the second back side magnet 5*b* are shown. The first back side magnet 5*a* and the second back side magnet 5*b* of this embodiment are arranged so that the magnetization directions facing the diameter inner side direction of the first back side magnet 5*a* and the second back side magnet 5*b* of this embodiment become parallel to the front side of the target 2.

As described above, when the first back side magnet 5*a* and the second back side magnet 5*b* having the same magnetization direction are arranged in parallel, magnetic force lines generated from the inner side face of the first back side magnet 5*a* repel magnetic force lines generated from the inner peripheral face of the second back side magnet 5*b*. With this repellence, many magnetic force lines extending toward the axial direction of the ring-shaped first back side magnet 5*a* and second back side magnet 5*b* can be generated. Also, regarding the magnetic force lines generated toward the axial direction of the first back side magnet 5*a* and the second back side magnet 5*b*, the magnetic force lines generated from the inner peripheral face of the first back side magnet 5*a* repel the magnetic force lines generated from the inner peripheral face of the second back side magnet 5*b*. Hence, magnetic force lines with high straightness along the axial direction of the first back side magnet 5*a* and the second back side magnet 5*b* can be generated.

The magnetization direction of the magnetic field guide magnet 3 and the magnetization direction of the first back side magnet 5*a* and the second back side magnet 5*b* with such a configuration are perpendicular to each other while the front end face of the magnetic field guide magnet 3 and the respective inner peripheral faces of the first back side magnet 5*a* and the second back side magnet 5*b* have the same polarity.

As described above, since the magnetization direction of the magnetic field guide magnet 3 and the magnetization direction of the first back side magnet 5*a* and the second back side magnet 5*b* are perpendicular to each other, the magnetic field formed by the magnetic field guide magnet 3 and the magnetic field formed by the first back side magnet 5*a* and the second back side magnet 5*b* can be combined. The back side magnetic field generation source 4*a* has the magnetization direction facing the front, like the magnetization direction facing the front of the magnetic field guide magnet 3 shown in FIG. 3.

With the above-described configurations of the magnetic field guide magnet 3, and the first back side magnet 5a and the second back side magnet 5b, and with the configuration in which the target 2 is arranged at the front of the magnetic field guide magnet 3, magnetic force lines passing through a tunnel part or a duct part formed by the inner peripheral face of the ring-shaped magnetic field guide magnet 3 along the magnetization direction of the magnetic field guide magnet 3 can be formed. Accordingly, the magnetic force lines passing through the evaporation face of the target 2 become parallel to the axis of the ring-shaped magnetic field guide magnet 3 or inclined toward the axis. That is, advantageous effects can be obtained such that the direction of the magnetic force lines passing through the evaporation face of the target 2 can be substantially perpendicular to the evaporation face, and the magnetic force lines with high straightness extending from the evaporation face of the target 2 toward the substrate 7 can be generated in a wide region of the evaporation face.

The back side magnetic field generation source 4a includes a single magnetic material 9a at the diameter inner side of the first back side magnet 5a and the second back side magnet 5b in addition to the first back side magnet 5a and the second back side magnet 5b with the above-described configurations.

The magnetic material 9a is a non-ring-shaped solid magnetic material, and serves as a magnetic core of the first back side magnet 5a and the second back side magnet 5b. The magnetic material 9a is provided to penetrate through the first back side magnet 5a and the second back side magnet 5b. The magnetic material 9a is disk-shaped or columnar-shaped and having the same diameter as the inner diameters of the first back side magnet 5a and the second back side magnet 5b. In this case, "non-ring shape" represents a solid shape such as a disk shape or a columnar shape, but does not represent an annular shape having a hole at an inner portion in the radial direction like a doughnut shape.

In other words, it can be said that the first back side magnet 5a and the second back side magnet 5b are arranged to surround and be closely attached to (closely contact) the outer periphery of the single magnetic material 9a. With this arrangement, the front end face of the first back side magnet 5a is substantially flush with the front end face of the magnetic material 9a, and the rear end face of the second back side magnet 5b is substantially flush with the rear end face of the magnetic material 9a.

Since the inner peripheral faces of the first back side magnet 5a and the second back side magnet 5b are closely attached to the magnetic material 9a, the magnetic force lines generated from the end faces of the first back side magnet 5a and the second back side magnet 5b can be induced in the axial direction of the first back side magnet 5a and the second back side magnet 5b. A repulsive action of magnetic forces near the axes of the first back side magnet 5a and the second back side magnet 5b can be increased. Consequently, magnetic force lines with high straightness along the axial direction of the first back side magnet 5a and the second back side magnet 5b can be generated. Many magnetic force lines with high straightness can be generated in a wide region of the evaporation face of the target 2 arranged at the front of the back side magnet 5a and the second back side magnet 5b.

Summarizing the configuration of the evaporation source 1a, the target 2, the magnetic field guide magnet 3, the first back side magnet 5a, the second back side magnet 5b, and the magnetic material 9a are coaxially arranged so that the respective axes are aligned with each other.

As shown in FIG. 3, since the inner peripheral faces of the first back side magnet 5a and the second back side magnet 5b are closely attached to the side face of the magnetic material 9a and thus the back side magnetic field generation source 4a is formed, the magnetic force lines emitted from the inner peripheral faces of the first back side magnet 5a and the second back side magnet 5b can be linearly induced in the axial direction of the first back side magnet 5a and the second back side magnet 5b. Hence, in the magnetic material 9a, the repulsive action of the magnetic force lines can be increased at a position close to the axis of the first back side magnet 5a and the second back side magnet 5b. Consequently, the back side magnetic field generation source 4a can generate many magnetic force lines with high straightness from a position close to the axis of the front end face of the magnetic material 9a toward the target 2.

Further, since the back side magnetic field generation source 4a generates the magnetic pole with the same magnetization direction as the magnetization direction of the magnetic field guide magnet 3, among the magnetic force lines from the back side magnetic field generation source 4a, magnetic force lines which start diverging from the substrate 7 repel the magnetic force lines of the magnetic field guide magnet 3 and then extend in the substrate 7 direction again. Accordingly, many magnetic force lines with high straightness can be generated in a wide region of the evaporation face of the target 2.

As described above, the magnetization direction of the magnetic field guide magnet 3 and the respective magnetization directions of the first back side magnet 5a and the second back side magnet 5b are only required to be perpendicular to each other while the respective inner peripheral faces of the first back side magnet 5a and the second back side magnet 5b have the same polarity. Therefore, the polarity of the magnetic field guide magnet 3 and the polarities of the first back side magnet 5a and the second back side magnet 5b may be opposite to those of the above-described configuration shown in FIG. 3, and the magnetization direction of the magnetic field guide magnet 3 and the respective magnetization directions of the first back side magnet 5a and the second back side magnet 5b may be inverted.

Next, a method of film deposition in the film deposition device 6 using the evaporation source 1a is described.

First, the chamber 11 is evacuated and a vacuum is generated, then inert gas such as argon gas (Ar) is introduced through the gas introduction port 13, and impurities such as an oxide on the substrate 7 of the target 2 are removed by sputtering. After the impurities are removed, the chamber 11 is evacuated again, and reactant gas is introduced into the vacuum chamber 11 through the gas introduction port 13.

In this state, if arc discharge is generated on the target 2 arranged in the chamber 11, the substance forming the target 2 becomes plasma and reacts with the reactant gas. Accordingly, a nitride film, an oxide film, a carbide film, a carbonitride film, an amorphous carbon film, etc., can be deposited on the substrate 7 placed on the rotating base 12.

The reactant gas may be selected from nitrogen gas ($N_2$), oxygen gas ($O_2$), and hydrocarbon gas such as methane ($CH_4$). The pressure of the reactant gas in the chamber 11 may be in a range from about 1 to 10 Pa. Also, during film deposition, the target 2 may be discharged by applying arc current in a range from 100 to 200 A, and a negative voltage in a range from 10 to 30 V may be preferably applied by the arc power supply 15. Further, a negative voltage in a range from 10 to 200 V may be preferably applied to the substrate 7 by the bias power supply 16.

Also, the magnetic field guide magnet 3 and the back side magnetic field generation source 4a may be preferably configured and arranged so that the magnetic flux density at the front side of the target 2 is 50 gausses or higher. As described above, by setting the lower limit of the magnetic flux density at the front side of the target 2, the film deposition can be reliably executed. The magnetic flux density at the front side of the target 2 may be more preferably 75 gausses or higher, and further preferably 100 gausses or higher.

In addition to setting the lower limit of the magnetic flux density, the magnetic flux density at the front side of the target 2 may be preferably 250 gausses or lower. By setting the upper limit of the magnetic flux density at the front side of the target 2, the film deposition can be further reliably executed. The magnetic flux density at the front side of the target 2 may be more preferably 225 gausses or lower, and further preferably 200 gausses or lower.

By employing the above-described magnetic flux density, an arc spot can be trapped on the surface of the target 2, and the film deposition by the arc discharge can be stably executed.

EXAMPLE 1

A distribution of magnetic force lines generated in the evaporation source 1a according to the first embodiment is described with reference to FIG. 4. The magnetic-force-line distribution diagram shown in FIG. 4 indicates a magnetic-force-line distribution from the rear of the back side magnetic field generation source 4a to the surface of the substrate 7. In the magnetic-force-line distribution diagram in FIG. 4, the right end represents the position of the surface of the substrate 7.

Respective experiment conditions are shown below. For example, the target 2 has dimensions of (100-mm φ×16-mm thickness). The magnetic field guide magnet 3 has dimensions of (inner diameter 150 mm, outer diameter 170 mm, height 10 mm). The distance from the front end face of the magnetic field guide magnet 3 to the rear face of the target 2 is 25 mm.

The first back side magnet 5a has dimensions of (inner diameter 150 mm, outer diameter 170 mm, height 20 mm). The distance from the front end face of the first back side magnet 5a to the rear face of the target 2 is 100 mm. The second back side magnet 5a has dimensions of (inner diameter 150 mm, outer diameter 170 mm, height 20 mm). The distance from the front end face of the second back side magnet 5b to the rear face of the target 2 is 130 mm. The interval between the first back side magnet 5a and the second back side magnet 5b is 10 mm.

The magnetic material 9a has dimensions of (150-mm φ×50-mm height). The magnetic field intensity at the evaporation face of the target 2 is 50 gausses or higher.

Figure 4:
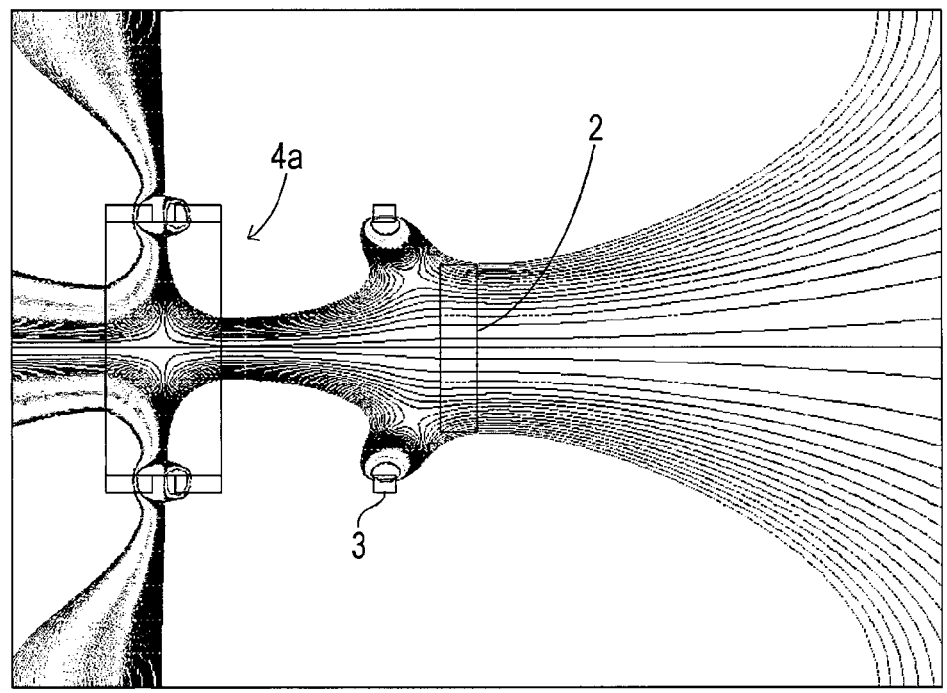
FIG. 4 is an illustration showing a magnetic-force-line distribution of the arc evaporation source according to the first embodiment.

Referring to FIG. 4, many magnetic force lines with high straightness are emitted from the first back side magnet 5a and the second back side magnet 5b toward the diameter inner side direction. The advancement direction of the magnetic force lines is changed substantially perpendicularly at a position near the axis of the magnetic material 9a to extend along the axial direction, and the magnetic force lines extend toward the target 2. The magnetic force lines are combined with the magnetic force lines emitted from the magnetic field guide magnet 3, and pass through the evaporation face of the target 2. The magnetic force lines with high straightness extend from the evaporation face of the target 2 in a wide region over the substantially entire face of the evaporation face of the target 2, and extend in the substrate direction. In other words, perpendicular magnetic force lines (perpendicular component) are present in the wide region over the substantially entire face of the evaporation face of the target 2.

An advantageous effect of the angle of the magnetic force lines passing through the evaporation face of the target 2 is described. As described above, during arc discharge, a thermoionic discharge spot (arc spot) called cathode spot is formed at the evaporation face of the target 2, the cathode spot is strongly affected by the magnetic field of the evaporation face of the target 2. If the magnetic force lines passing through the evaporation face of the target 2 are inclined with respect to the line normal to the evaporation face, a horizontal magnetic force component is generated at the evaporation face of the target 2. In this case, when it is assumed that B is a magnetic flux density of the inclined magnetic force lines, and an angle θ is an angle between the magnetic force lines and the evaporation face of the target, the horizontal magnetic force component becomes B cos θ. Regarding a characteristic that the cathode spot moves in the opposite direction of j×B (j is arc current), a force of F=−j×B cos θ acts on the cathode spot.

That is, if the angle of the magnetic force lines is outward (outer periphery direction of the target 2), the cathode spot receives a force toward the outer periphery direction of the target 2 and moves. If the cathode spot receives the outward force and moves in the outer periphery direction, the cathode spot may jump from the surface of the target, and discharge abnormality may be generated. In contrast, if the angle of the magnetic force lines is inward (target center direction), the cathode spot receives a force in the direction toward the center direction of the target 2 and moves. Therefore, to restrict the aforementioned arc discharge abnormality, it is desirable to form a magnetic field in which the angle of magnetic force lines is inward rather than in the outer periphery direction in an outermost periphery portion of the evaporation face of the target 2.

As described above, the evaporation source 1a described in this embodiment forms magnetic force lines with high straightness extending in the substrate direction by the magnetic field guide magnet 3 and the back side magnetic field generation source 4a. The target 2 is arranged at a position at which the perpendicular magnetic force lines (perpendicular component) pass through the wide region over the substantially entire face of the evaporation face of the target 2 among the formed magnetic force lines.

With the evaporation source 1a according to this embodiment, since the perpendicular magnetic force lines (perpendicular component) are present in the wide region over the substantially entire face of the evaporation face of the target 2, the arc spot can be trapped on the evaporation face of the target 2, and uneven wear of the evaporation face of the target 2 can be restricted. Accordingly, the film deposition by the arc discharge can be stably executed.

Second Embodiment

A second embodiment of the present invention is described with reference to FIGS. 5 to 6.

Figure 5:
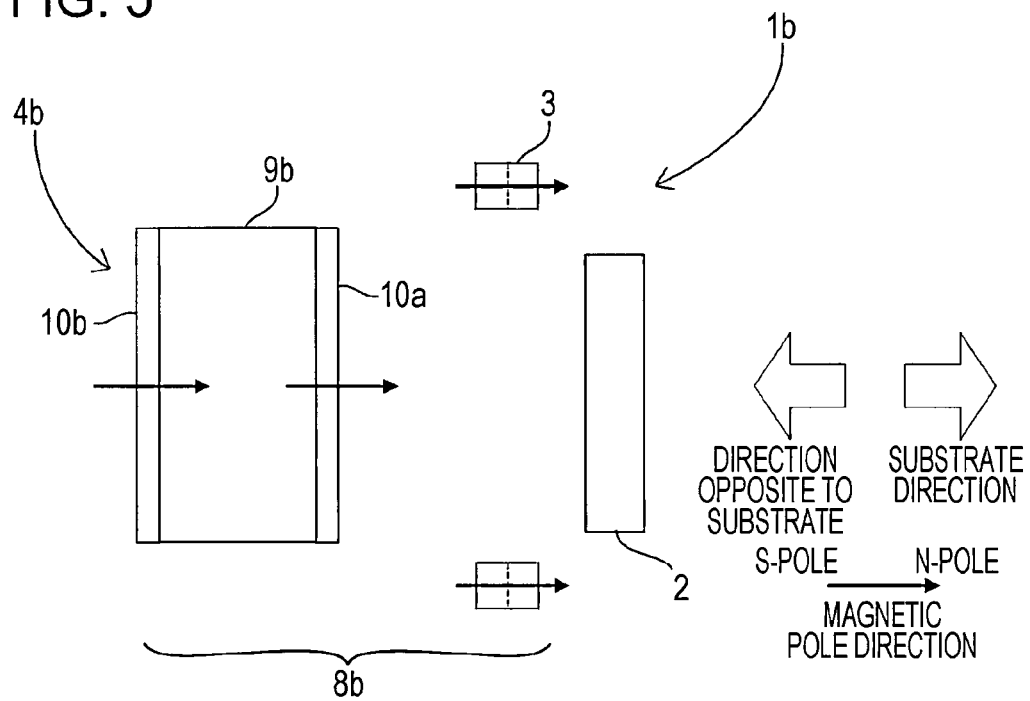
FIG. 5 is a schematic illustration showing a specific configuration of an arc evaporation source according to a second embodiment of the present invention.

FIG. 5 is an illustration showing a brief configuration of an arc evaporation source 1b (hereinafter, referred to as evaporation source 1b) being a specific configuration of the arc evaporation source 1 included in the film deposition device 6 according to this embodiment. In the film deposition device 6 according to this embodiment, the configuration other than the evaporation source 1b is similar to the configuration described in the first embodiment. Hence, the description of the similar component is omitted and the same reference number is applied to the similar component.

The evaporation source 1b according to this embodiment is formed of, similarly to the evaporation source 1a according to the first embodiment, a disk-shaped target 2 having a predetermined thickness, and magnetic field forming means 8b arranged near the target 2. The magnetic field forming means 8b includes a magnetic field guide magnet 3 similar to that of the first embodiment and a back side magnetic field generation source 4b.

The back side magnetic field generation source 4b is formed of a non-ring-shaped solid magnetic material 9b serving as a magnetic core, and a first disk-shaped back side magnet 10a and a second disk-shaped back side magnet 10b sandwiching the magnetic material 9b. The first disk-shaped back side magnet 10a and the second disk-shaped back side magnet 10b are also non-ring-shaped similarly to the magnetic material 9b. Based on past findings, it is known that the back side magnet requires having a certain thickness to efficiently extend magnetic force lines in the substrate direction. In this embodiment, the first disk-shaped back side magnet 10a and the second disk-shaped back side magnet 10b being two magnetic plates are arranged in parallel at an interval to ensure the thickness, and the interval is filled with the magnetic material 9b to prevent the magnetic force from decreasing.

As shown in FIG. 5, the first disk-shaped back side magnet 10a and the second disk-shaped back side magnet 10b are magnetized so that one of disk faces of each disk-shaped back side magnet serves as the N-pole and the other disk face serves as the S-pole. The first disk-shaped back side magnet 10a and the second disk-shaped back side magnet 10b sandwich the magnetic material 9b by the disk face at the S-pole side of the first disk-shaped back side magnet 10a and the disk face at the N-pole side of the second disk-shaped back side magnet 10b, and the magnetization directions are aligned in the same direction toward the target 2.

An advantageous effect that is obtained when the two disk-shaped back side magnets 10a and 10b having the same magnetization direction are arranged in parallel at an interval and the magnetic material 9b is arranged to be closely attached to the two disk-shaped back side magnets 10a and 10b is as follows.

Since the first disk-shaped back side magnet 10a and the second disk-shaped back side magnet 10b are arranged in parallel at an interval, the straightness of magnetic force lines generated from each disk-shaped back side magnet is increased. Further, since the magnetic material 9b is arranged between the first disk-shaped back side magnet 10a and the second disk-shaped back side magnet 10b, the magnetic material 9b serves as a magnetic guide. Accordingly, the straightness of magnetic force lines generated from the disk-shaped back side magnets can be further increased.

As described above, by arranging the back side magnetic field generation source 4b, in which the two disk-shaped back side magnets sandwich the magnetic material 9b, at the back side of the target 2, many magnetic force lines with high straightness can be generated in a wide region of the evaporation face of the target 2.

The back side magnetic field generation source 4b configured as described above is arranged at the side of the back side of the target 2 so that the magnetization direction of the back side magnetic field generation source 4b extends along the axis of the target 2 and is perpendicular to the evaporation face of the target 2, and the N-pole side of the first disk-shaped back side magnet 10a faces the target 2. At this time, the back side magnetic field generation source 4b is arranged so that the axis of the back side magnetic field generation source 4b is substantially aligned with the axis of the target 2.

As shown in FIG. 5, the evaporation source 1b is configured such that the target 2 is arranged at the front of the back side magnetic field generation source 4b configured as described above, that is, at the front of the magnetic field guide magnet 3, coaxially with the back side magnetic field generation source 4b and the magnetic field guide magnet 3. At this time, the magnetization direction of the magnetic field guide magnet 3 faces a direction perpendicular to the evaporation face of the target 2, that is, the substrate direction. The magnetic pole at the side of the front end face being the annular face of the magnetic field guide magnet 3 is the N-pole, and the magnetic pole at the target 2 side of the back side magnetic field generation source 4b is also the N-pole. The magnetic pole at the front end face side of the magnetic field guide magnet 3 and the magnetic pole at the target 2 side of the back side magnetic field generation source 4b are the same polarity.

As described above, since the magnetic field guide magnet 3 and the back side magnetic field generation source 4b have the same polarity facing the target 2, the magnetic field formed by the magnetic field guide magnet 3 and the magnetic field formed by the back side magnetic field generation source 4b can be combined. Hence, advantageous effects can be obtained such that the direction of the magnetic force lines passing through the evaporation face of the target 2 can be substantially perpendicular to the evaporation face, and the magnetic force lines can be linearly induced in the direction toward the substrate 7.

As described above, as long as the magnetic field guide magnet 3 and the back side magnetic field generation source 4b have the same magnetic pole facing the target 2, the evaporation source 1b may be configured such that the S-poles of the magnetic field guide magnet 3 and the back side magnetic field generation source 4b face the target 2.

EXAMPLE 2

A distribution of magnetic force lines generated in the evaporation source 1b according to the second embodiment is described with reference to FIG. 6. The magnetic-force-line distribution diagram shown in FIG. 6 indicates a magnetic-force-line distribution from the rear of the back side magnetic field generation source 4b to the surface of the substrate 7. In the magnetic-force-line distribution diagram in FIG. 6, the right end represents the position of the surface of the substrate 7.

Experimental conditions in EXAMPLE 2 described below are provided. For example, the target 2 has dimensions of (100-mm φ×16-mm thickness). The first disk-shaped back side magnet 10a and the second disk-shaped back side magnet 10b each have dimensions of (10-mm φ×4-mm thickness). The magnetic material 9b has dimensions of (100-mm φ×30-mm thickness). The magnetic field guide magnet 3 has dimensions of (inner diameter of 150 mm φ, outer diameter of 170 mm, and thickness of 10 mm). The magnetic flux density at the surface of the target 2 is 50 gausses or higher.

The distance from the front end face of the magnetic field guide magnet 3 to the rear face of the target 2 is 25 mm.

Also, the distance from the front end face of the first disk-shaped back side magnet 10a to the rear face of the target 2 is 100 mm.

Figure 6:
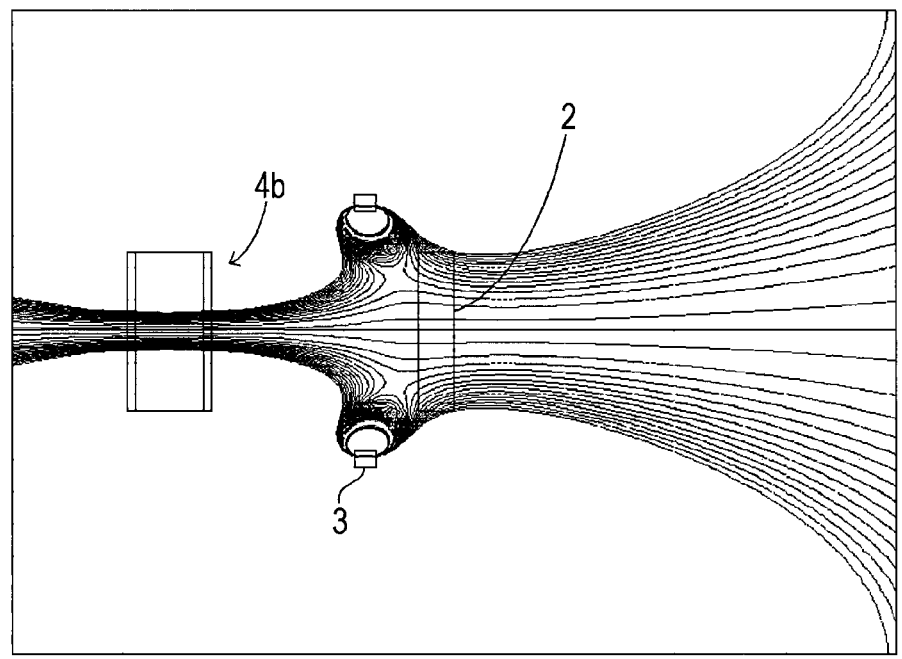
FIG. 6 is an illustration showing a magnetic-force-line distribution of the arc evaporation source according to the second embodiment.

Referring to FIG. 6, many magnetic force lines with high straightness are emitted from the first disk-shaped back side magnet 10a and the second disk-shaped back side magnet 10b of the back side magnetic field generation source 4b toward the target 2. The magnetic force lines extend toward the target 2 so that the advancement direction extends along the axial direction of the magnetic material 9b. The magnetic force lines are combined with the magnetic force lines emitted from the magnetic field guide magnet 3, and pass through the evaporation face of the target 2. Similarly to the evaporation source 1a according to the first embodiment, the magnetic force lines with high straightness extend from the evaporation face of the target 2 in a wide region over the substantially entire face of the evaporation face of the target 2, and extend in the substrate direction. In other words, perpendicular magnetic force lines (perpendicular component) are present in the wide region over the substantially entire face of the evaporation face of the target 2.

As described above, the evaporation source 1b described in this embodiment forms magnetic force lines with high straightness extending toward the substrate direction by the magnetic field guide magnet 3 and the back side magnetic field generation source 4b. The target 2 is arranged at a position at which the perpendicular magnetic force lines (perpendicular component) pass through the wide region over the substantially entire face of the evaporation face of the target 2 among the formed magnetic force lines.

With the evaporation source 1b according to this embodiment, perpendicular magnetic force lines (perpendicular component) are present in the wide region over the substantially entire face of the evaporation face of the target 2. Accordingly, the arc spot can be trapped on the evaporation face of the target 2, uneven wear of the evaporation face of the target 2 can be restricted, and the film deposition by the arc discharge can be stably executed.

Third Embodiment

A third embodiment of the present invention is described with reference to FIGS. 7 to 8.

Figure 7:
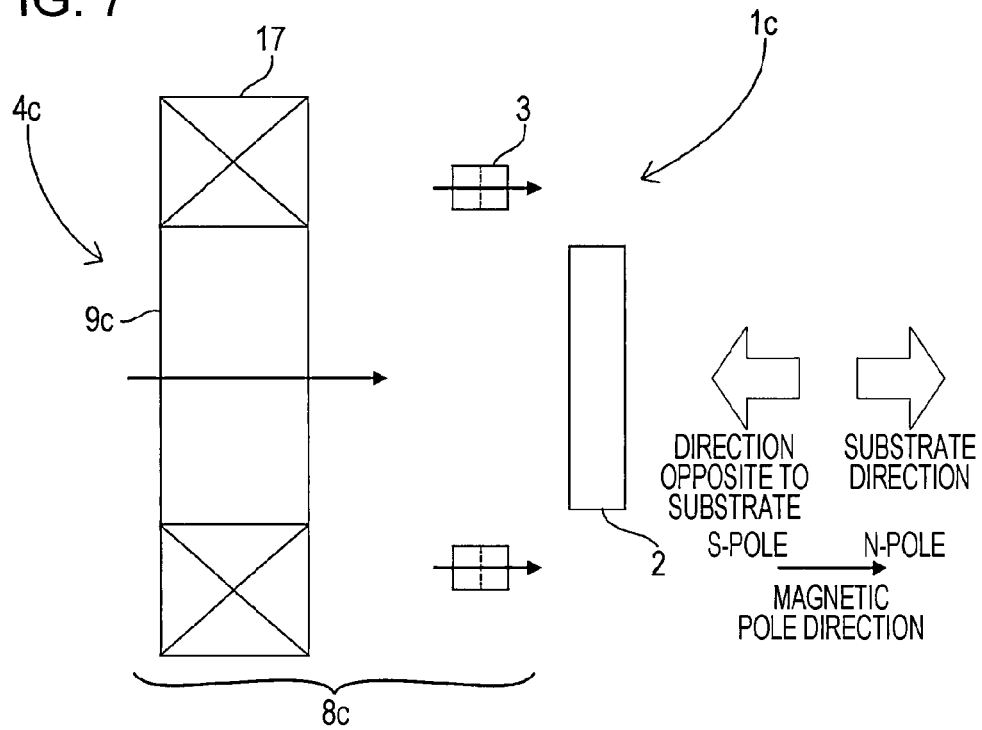
FIG. 7 is a schematic illustration showing a specific configuration of an arc evaporation source according to a third embodiment of the present invention.

FIG. 7 is an illustration showing a brief configuration of an arc evaporation source 1c (hereinafter, referred to as evaporation source 1c) being a specific configuration of the arc evaporation source 1 included in the film deposition device 6 according to this embodiment. In the film deposition device 6 according to this embodiment, the configuration other than the evaporation source 1c is similar to the configuration described in the first embodiment. Hence, the description of the similar component is omitted and the same reference number is applied to the similar component.

The evaporation source 1c according to this embodiment is formed of, similarly to the evaporation source 1a according to the first embodiment, a disk-shaped target 2 having a predetermined thickness, and magnetic field forming means 8c arranged near the target 2. The magnetic field forming means 8c includes a magnetic field guide magnet 3 similar to that of the first embodiment and a back side magnetic field generation source 4c.

The back side magnetic field generation source 4c includes an air-cored electro-magnetic coil 17 formed by substantially coaxially winding a conductor in a ring shape (annular shape), and a single magnetic material 9c inserted into an air core portion, which is a hole formed at the diameter inner side of the ring-shaped electro-magnetic coil 17.

The electro-magnetic coil 17 is a solenoid formed in a ring shape. For example, the number of winding times is about several hundreds of times (for example, 410 times). Winding is provided so that the coil has a larger diameter than the diameter of the target 2. In this embodiment, a magnetic field is generated with a number of amperes being about 5000 A·T.

The magnetic material 9c is the non-ring-shaped solid magnetic material 9c, and serves as a magnet core of the electro-magnetic coil 17. The magnetic material 9c is provided at the air core portion of the electro-magnetic coil 17 to penetrate through the electro-magnetic coil 17, and has a disk shape or a columnar shape having substantially the same diameter as the inner diameter of the electro-magnetic coil 17.

In other words, the electro-magnetic coil 17 is arranged to surround outer periphery of the single magnetic material 9c in a closely attached manner (closely contacting manner). With this arrangement, the front end face of the electro-magnetic coil 17 is substantially flush with the front end face of the magnetic material 9c, and the rear end face of the electro-magnetic coil 17 is substantially flush with the rear end face of the magnetic material 9c.

An advantageous effect obtained by arranging the electro-magnetic coil 17 is as follows.

Since the electro-magnetic coil 17 can generate magnetic force lines with high straightness from an area around the coil axis, by arranging the magnetic material 9c at the air core portion of the electro-magnetic coil 17, the straightness of the magnetic force lines generated from the area around the coil axis can be increased. Hence, by arranging the electro-magnetic coil 17 at the back side of the target 2, many magnetic force lines with high straightness can be generated over the wide region of the evaporation face of the target 2.

Summarizing the configuration of the evaporation source 1c, the target 2, the magnetic field guide magnet 3, the electro-magnetic coil 17, and the magnetic material 9c are coaxially arranged so that the respective axes are aligned with each other. As shown in FIG. 7, by closely attaching the inner peripheral face of the electro-magnetic coil 17 to the side face of the magnetic material 9c, the density of magnetic force lines generated from the electro-magnetic coil 17 can be increased at a position close to the axis of the electro-magnetic coil 17. Consequently, many magnetic force lines with high straightness can be generated from a position close to the axis of the front end face of the magnetic material 9c toward the target 2.

EXAMPLE 3

A distribution of magnetic force lines generated in the evaporation source 1c according to the third embodiment is described with reference to FIG. 8. The magnetic-force-line distribution diagram shown in FIG. 8 indicates a magnetic-force-line distribution from the rear of the back side magnetic field generation source 4c to the surface of the substrate 7. In the magnetic-force-line distribution diagram in FIG. 8, the right end represents the position of the surface of the substrate 7.

Experimental conditions in EXAMPLE 3 described below are provided. For example, the magnetic field guide magnet 3 has dimensions of (inner diameter of 150 mm φ, outer diameter of 170 mm, and thickness of 10 mm). The target 2 has dimensions of (100-mm φ×16-mm thickness). The magnetic flux density at the surface of the target 2 is 50 gausses or higher. The electro-magnetic coil 17 is a solenoid formed in a ring shape having an inner diameter at the air core portion of 100 mm φ, an outer diameter of 170 mm, and a thickness of 50 mm. For example, the number of winding times is 410 times. The magnetic material 9c arranged at the air core portion of the electro-magnetic coil 17 has dimensions of (100-mm φ×50-mm thickness).

The distance from the front end face of the magnetic field guide magnet 3 to the rear face of the target 2 is 25 mm. Also, the distance from the front end face of the magnetic material 9c to the rear face of the target 2 is 100 mm.

Figure 8:
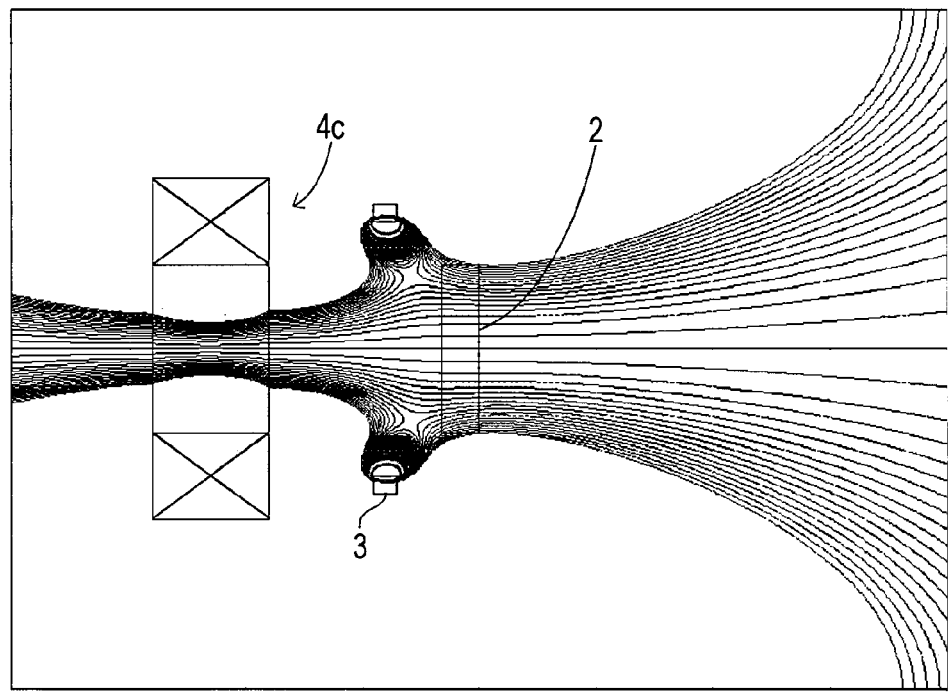
FIG. 8 is an illustration showing a magnetic-force-line distribution of the arc evaporation source according to the third embodiment.

Referring to FIG. 8, many magnetic force lines with high straightness are emitted from the magnetic material 9c of the back side magnetic field generation source 4c toward the target 2. The magnetic force lines extend toward the target 2 so that the advancement direction extends along the axial direction of the magnetic material 9c. The magnetic force lines are combined with the magnetic force lines emitted from the magnetic field guide magnet 3, and pass through the evaporation face of the target 2. Similarly to the evaporation source 1a according to the first embodiment, the magnetic force lines with high straightness extend from the evaporation face of the target 2 in a wide region over the substantially entire face of the evaporation face of the target 2, and extend in the substrate direction. In other words, perpendicular magnetic force lines (perpendicular component) are present in the wide region over the substantially entire face of the evaporation face of the target 2.

As described above, the evaporation source 1c described in this embodiment forms magnetic force lines with high straightness extending in the substrate direction by the magnetic field guide magnet 3 and the back side magnetic field generation source 4c. The target 2 is arranged at a position at which the perpendicular magnetic force lines (perpendicular component) pass through the wide region over the substantially entire face of the evaporation face of the target 2 among the formed magnetic force lines.

With the evaporation source 1c according to this embodiment, perpendicular magnetic force lines (perpendicular component) are generated in the wide region over the substantially entire face of the evaporation face of the target 2. Accordingly, the arc spot can be trapped on the evaporation face of the target 2, uneven wear of the evaporation face of the target 2 can be restricted, and the film deposition by the arc discharge can be stably executed.

With the above-described first to third embodiments, magnetic force lines extending inward or substantially parallel to the line normal to the evaporation face of the target 2 can be formed. Not only the abnormal discharge can be restricted during the arc discharge according to the direction of the magnetic force lines, but also more stable discharge than discharge in the past can be obtained. The stabilization of discharge can provide arc discharge in the entire evaporation face of the target 2. Hence, the yield of use of the target 2 can be increased.

Also, according to the first to third embodiments, many magnetic force lines with high straightness can be formed from the entire evaporation face of the target 2 in the direction toward the substrate 7. Accordingly, during the arc discharge, transportation efficiency of particles (ions) evaporated from the target 2 to a workpiece can be increased, and the film deposition speed can be increased.

The currently disclosed embodiments are merely examples in all points of view, and do not intend to have limitation. In particular, in the currently disclosed embodiments, a matter not specifically disclosed, for example, values easily expected by normal persons skilled in the art are employed for operation conditions, measurement conditions, various parameters, dimensions, a weight, and a volume of components, etc., without departing from a range normally implemented by those skilled in the art.

For example, in the description of the evaporation source according to each of the respective embodiments, expressions such as being parallel, perpendicular, and the same, and expressions such as coaxial are used for the shape and dimension of each component. However, the state of being parallel, perpendicular, the same, and coaxial is not determined in a mathematically strict sense. An error in a range in which the state is expected to be parallel, perpendicular, the same, and coaxial is of course permitted in terms of machining accuracy and assembling accuracy of a normal machine part.

Also, the shape of the target 2 is not limited to the disk shape, and may be a polygonal shape such as a rectangular shape. Further, the shapes of the magnetic field guide magnet 3 and the back side magnetic field generation source 4a to 4c are not limited to the circular annular shapes, and may be a polygonal annular shape such as a rectangular shape.

This application has been described in detail with reference to the specific embodiments. However, it is obvious to those skilled in the art that various modifications and corrections may be added without departing from the spirit and scope of the present invention.

This application is based on Japanese Patent Application filed Jun. 20, 2012 (No. 2012-139078), and the content of which is hereby incorporated by reference herein.

INDUSTRIAL APPLICABILITY

With the arc evaporation source of the present invention, the magnetic force lines with high straightness extending from the surface of the target in the substrate direction can be generated in the wide region of the surface of the target, and the uneven wear of the target can be restricted.

REFERENCE SIGNS LIST

1, 1a, 1b, 1c arc evaporation source (evaporation source)
2 target
3 magnetic field guide magnet
4, 4a, 4b, 4c back side magnetic field generation source
5a first back side magnet
5b second back side magnet
6 film deposition device
7 substrate
8a, 8b, 8c magnetic field forming means
9a, 9b, 9c magnetic material
10a first disk-shaped back side magnet
10b second disk-shaped back side magnet
11 vacuum chamber
12 rotating base
13 gas introduction port
14 gas exhaust port
15 arc power supply
16 bias power supply
17 electro-magnetic coil
18 ground

The invention claimed is:
1. An arc evaporation source in a film deposition device having means for supporting a substrate, comprising:

a disk shaped target having a front side evaporation face facing a substrate supported by the substrate supporting means at a front side of the target, the target further having a back side that is opposite and to the rear of the evaporation face in a direction perpendicular to the evaporation face, a ring-shaped magnetic field guide magnet arranged entirely to the rear of the front side evaporation face of the target and having a polarity with a magnetization direction extending along the direction perpendicular to the evaporation face of the target, wherein an inner diameter of the ring-shaped magnetic field guide magnet is larger than an outer peripheral diameter of the disk shaped target, and a back side magnetic field generation source arranged to the rear of the ring-shaped magnetic field guide magnet, and forming magnetic force lines extending along the magnetization direction of the ring-shaped magnetic field guide magnet, wherein the back side magnetic field generation source includes a ring-shaped back side magnet having polarities at a radially inner peripheral face and a radially outer peripheral face, wherein a magnetization direction of the back side magnet by the polarities of the inner peripheral face and the outer peripheral face of the ring-shaped back side magnet is radially inward, and the magnetization direction of the ring-shaped magnetic field guide magnet faces the front side.

2. The arc evaporation source according to claim 1, wherein a magnetization direction of the back side magnetic field generation source is the same as the magnetization direction of the ring-shaped magnetic field guide magnet.

3. The arc evaporation source according to claim 1, wherein the back side magnetic field generation source forms magnetic force lines passing through a tunnel part or a duct part formed by an inner peripheral face of the ring-shaped magnetic field guide magnet, along the magnetization direction of the ring-shaped magnetic field guide magnet, and wherein the target is arranged at a position so that the magnetic force lines passing through the evaporation face become parallel to an axis of the ring-shaped magnetic field guide magnet or inclined toward the axis.

4. The arc evaporation source according to claim 1, wherein the back side magnetic field generation source includes a plurality of the ring-shaped back side magnets, and the plurality of ring-shaped back side magnets have polarities with the same magnetization direction and are coaxially arranged.

5. The arc evaporation source according to claim 4, wherein a magnetic material penetrating through each back side magnet is provided at a radially inner side of the plurality of ring-shaped back side magnets, and an outer periphery of the magnetic material contacts the inner peripheral face of each back side magnet.

6. An arc evaporation source in a film deposition device having means for supporting a substrate, comprising:

a disk shaped target having a front side evaporation face facing a substrate supported by the substrate supporting means at a front side of the target, the target further having a back side that is opposite and to the rear of the evaporation face in a direction perpendicular to the evaporation face, a ring-shaped magnetic field guide magnet arranged entirely to the rear of the front side evaporation face of the target and having a polarity with a magnetization direction extending along the direction perpendicular to the evaporation face of the target, wherein an inner diameter of the ring-shaped magnetic field guide magnet is larger than an outer peripheral diameter of the disk shaped target, and a back side magnetic field generation source arranged to the rear of the ring-shaped magnetic field guide magnet, and forming magnetic force lines extending along the magnetization direction of the ring-shaped magnetic field guide magnet, wherein the back side magnetic field generation source includes a first disk-shaped magnet and a second disk-shaped magnet having disk shapes and arranged at an interval, the first disk-shaped magnet and the second disk-shaped magnet each have polarities at disk-shaped faces with a magnetization direction from one of the disk-shaped faces to the other disk-shaped face and are arranged to have the same magnetization direction, the magnetization direction by the first disk-shaped magnet and the second disk-shaped magnet faces the front side and the magnetization direction of the ring-shaped magnetic field guide magnet faces the front side.

7. The arc evaporation source according to claim 6, wherein a magnetic material is provided between the first disk-shaped magnet and the second disk-shaped magnet, the magnetic material contacting each disk-shaped magnet.

8. The arc evaporation source according to claim 1, wherein the back side magnetic field generation source is an air-cored electro-magnetic coil, and the electro-magnetic coil has a polarity in the same direction as the direction of the polarity of the ring-shaped magnetic field guide magnet.

9. The arc evaporation source according to claim 8, wherein a magnetic material is arranged in an air core portion of the electro-magnetic coil.

10. An arc evaporation source in a film deposition device having means for supporting a substrate, comprising:

a disk shaped target having a front side evaporation face facing a substrate supported by the substrate supporting means at a front side of the target, the target further having a back side that is opposite and to the rear of the evaporation face in a direction perpendicular to the evaporation face, a ring-shaped magnetic field guide magnet arranged entirely to the rear of the front side evaporation face of the target and having a polarity with a magnetization direction extending along the direction perpendicular to the evaporation face of the target, wherein an inner diameter of the ring-shaped magnetic field guide magnet is larger than an outer peripheral diameter of the disk shaped target, and a back side magnetic field generation source arranged to the rear of the ring-shaped magnetic field guide magnet, and forming magnetic force lines extending along the magnetization direction of the ring-shaped magnetic field guide magnet, wherein the back side magnetic field generation source includes a ring-shaped back side magnet having polarities at a radially inner peripheral face and a radially outer peripheral face, wherein a magnetization direction of the back side magnet by the polarities of the inner peripheral face and the outer peripheral face of the ring-shaped back side magnet is radially outward, and the magnetization direction of the ring-shaped magnetic field guide magnet faces a rear side which is a side opposite the front side in the direction perpendicular to the evaporation face.

11. An arc evaporation source in a film deposition device having means for supporting a substrate, comprising:
a disk shaped target having a front side evaporation face facing a substrate supported by the substrate supporting means at a front side of the target, the target further having a back side that is opposite and to the rear of the evaporation face in a direction perpendicular to the evaporation face,
a ring-shaped magnetic field guide magnet arranged entirely to the rear of the front side evaporation face of the target and having a polarity with a magnetization direction extending along the direction perpendicular to the evaporation face of the target, wherein an inner diameter of the ring-shaped magnetic field guide magnet is larger than an outer peripheral diameter of the disk shaped target, and
a back side magnetic field generation source arranged to the rear of the ring-shaped magnetic field guide magnet, and forming magnetic force lines extending along the magnetization direction of the ring-shaped magnetic field guide magnet, wherein the back side magnetic field generation source includes a first disk-shaped magnet and a second disk-shaped magnet having disk shapes and arranged at an interval, the first disk-shaped magnet and the second disk-shaped magnet each have polarities at disk-shaped faces with a magnetization direction from one of the disk-shaped faces to the other disk-shaped face and are arranged to have the same magnetization direction, the magnetization direction by the first disk-shaped magnet and the second disk-shaped magnet faces the rear and the magnetization direction of the ring-shaped magnetic field guide magnet faces a rear side which is a side opposite the front side in the direction perpendicular to the evaporation face.

12. An arc evaporation source in a film deposition device having means for supporting a substrate, comprising:
a disk shaped target having a front side evaporation face at an end of the disk shaped target in the axial direction of the disk shaped target, the front side facing a substrate supported by the substrate supporting means, the target further having a back side at the other end of the disk shaped target in the axial direction of the disk shaped target, which back side is opposite and to the rear of the evaporation face in the axial direction,
a ring-shaped magnetic field guide magnet having a ring axis extending in said axial direction, arranged entirely to the rear of the front side evaporation face of the target in the axial direction and having a polarity with a magnetization direction extending along the axial direction, and
a back side magnetic field generation source arranged to the rear of the ring-shaped magnetic field guide magnet in the axial direction, and forming magnetic force lines extending along the magnetization direction of the ring-shaped magnetic field guide magnet,
wherein the back side magnetic field generation source includes a ring-shaped back side magnet having polarities at inner and outer peripheral faces of the ring-shaped back side magnet in a radial direction perpendicular to the axial direction.

* * * * *